(12) United States Patent
Cheng et al.

(10) Patent No.: US 11,198,792 B2
(45) Date of Patent: Dec. 14, 2021

(54) METHOD FOR PREPARING PATTERNED COVERLAY ON SUBSTRATE

(71) Applicant: ETERNAL MATERIALS CO., LTD., Kaohsiung (TW)

(72) Inventors: Chung-Kai Cheng, Kaohsiung (TW); Chung-Jen Wu, Kaohsiung (TW); Meng-Yen Chou, Kaohsiung (TW); Chang-Hong Ho, Kaohsiung (TW); Po-Yu Huang, Kaohsiung (TW); Shun-Jen Chiang, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 400 days.

(21) Appl. No.: 15/650,648

(22) Filed: Jul. 14, 2017

(65) Prior Publication Data

US 2018/0282577 A1    Oct. 4, 2018

(30) Foreign Application Priority Data

Mar. 31, 2017 (TW) ................. 106111471

(51) Int. Cl.
*C09D 179/08* (2006.01)
*C08G 73/10* (2006.01)
(Continued)

(52) U.S. Cl.
CPC .......... *C09D 179/08* (2013.01); *B32B 27/281* (2013.01); *C08G 73/1003* (2013.01);
(Continued)

(58) Field of Classification Search
CPC .... C09D 179/08; H05K 1/0393; H05K 3/007; H05K 3/0064; H05K 2203/0156;
(Continued)

(56) References Cited

U.S. PATENT DOCUMENTS 8,105,752 B2    1/2012    Chou et al.
8,673,540 B2    3/2014    Chou et al.
(Continued)

FOREIGN PATENT DOCUMENTS

EP    1550698 A2 *    7/2005
JP    5-82927 A    4/1993
(Continued)

OTHER PUBLICATIONS

Machine English translation of JP2008049486.
(Continued)

*Primary Examiner* — Cynthia L Schaller
(74) *Attorney, Agent, or Firm* — Ladas & Parry LLP

(57) ABSTRACT

The present invention relates to a method for preparing a patterned polyimide coverlay on a substrate. The method includes: providing a polyimide dry film including a carrier and a non-photosensitive polyimide layer on the carrier, the non-photosensitive polyimide layer containing (i) a polyimide precursor or soluble polyimide and (ii) a solvent; forming a predetermined pattern in the polyimide dry film; laminating the patterned polyimide dry film onto a substrate in such a manner that the non-photosensitive polyimide layer faces the substrate; and forming a patterned polyimide coverlay by heating.

6 Claims, 3 Drawing Sheets

(51) Int. Cl.
    H01L 27/32    (2006.01)
    C08G 73/14    (2006.01)
    C08L 63/00    (2006.01)
    H05K 3/00     (2006.01)
    C09J 7/35     (2018.01)
    B32B 27/28    (2006.01)
    H05K 1/03     (2006.01)
    B29K 79/00    (2006.01)

(52) U.S. Cl.
    CPC ..... *C08G 73/1039* (2013.01); *C08G 73/1067* (2013.01); *C08G 73/14* (2013.01); *C08L 63/00* (2013.01); *C09J 7/35* (2018.01); *H01L 27/3241* (2013.01); *H05K 1/0393* (2013.01); *H05K 3/007* (2013.01); *H05K 3/0064* (2013.01); *B29K 2079/08* (2013.01); *C09J 2203/326* (2013.01); *C09J 2479/08* (2013.01); *C09J 2479/086* (2013.01); *H05K 2201/0154* (2013.01); *H05K 2203/016* (2013.01); *H05K 2203/0156* (2013.01)

(58) Field of Classification Search
    CPC ..... H05K 2201/0154; H05K 2203/016; C08G 73/1067; C08G 73/1039; C08G 73/1003; C08G 73/14; C09J 7/35; C09J 2479/08; C09J 2203/326; C09J 2479/086; B32B 27/281; C08L 63/00; H01L 27/3241; B29K 2079/08
    See application file for complete search history.

(56) References Cited

U.S. PATENT DOCUMENTS

| | | | |
|---|---|---|---|
| 8,735,534 B2 | 5/2014 | Wu et al. | |
| 8,932,801 B2 | 1/2015 | Chou et al. | |
| 9,334,369 B2 | 5/2016 | Cheng et al. | |
| 9,617,223 B2 | 4/2017 | Cheng et al. | |
| 2003/0001237 A1* | 1/2003 | Yang | H05K 3/002 257/622 |
| 2006/0234045 A1 | 10/2006 | Nakanishi et al. | |
| 2008/0096997 A1 | 4/2008 | Wu et al. | |
| 2011/0212402 A1 | 9/2011 | Chou et al. | |
| 2012/0015178 A1 | 1/2012 | Yada | |
| 2012/0308816 A1 | 12/2012 | Kohama et al. | |
| 2016/0017105 A1* | 1/2016 | Wu | B32B 37/003 156/60 |

FOREIGN PATENT DOCUMENTS

| | | |
|---|---|---|
| JP | 9-18114 A | 1/1997 |
| JP | H0918114 A | 1/1997 |
| JP | 2008049486 A | 3/2008 |
| JP | 2011222780 A | 11/2011 |
| JP | 2015-61763 A | 4/2015 |
| JP | 2016-29479 A | 3/2016 |
| TW | 200704735 A | 2/2007 |
| TW | 200821339 A | 5/2008 |
| TW | 200906910 A | 2/2009 |
| TW | 1311142 B | 6/2009 |
| TW | 201014876 A | 4/2010 |
| TW | 201014877 A | 4/2010 |
| TW | 201024337 A | 7/2010 |
| TW | 201131290 A1 | 9/2011 |
| TW | 1383251 B | 1/2013 |
| TW | 201326136 A1 | 7/2013 |
| TW | 201604227 A | 2/2016 |
| WO | 20100074014 A1 | 6/2012 |

OTHER PUBLICATIONS

Machine English translation of JP2011222780.
Office Action dated Sep. 12, 2018 in corresponding Korean Patent Application No. 10-2017-0089918.
English translation of Office Action dated Sep. 12, 2018 in corresponding Korean Patent Application No. 10-2017-0089918.
Machine English translation of WO2010/074014.
Machine English translation of JPH0918114.
Non-English Japanese Office Action dated Jun. 27, 2018 with English translation for Application No. JP 2017-138500.
espacenet English abstract of JP 5-82927 A.
espacenet English abstract of JP 2015-61763 A.
espacenet English abstract of JP 2016-29479 A.
espacenet English abstract of JP 9-18114 A.
Non-English Taiwanese Office Action dated Aug. 28, 2017 and English translation of the Search Report for Taiwan Application No. 10611471.
espacenet English abstract of TW 200704735 A.
espacenet English abstract of TW 200821339 A.
espacenet English abstract of TW 200906910 A.

* cited by examiner

METHOD FOR PREPARING PATTERNED COVERLAY ON SUBSTRATE

BACKGROUND OF THE INVENTION

1. Field of the Invention

The present invention relates to a method for preparing a patterned coverlay on a substrate, and particularly to a method for preparing a patterned coverlay on a flexible printed circuit board.

2. Description of the Related Art

In recent years, it has been emphasized that electronic products should be lighter, thinner, shorter or smaller, and thus the size of various electronic parts and components has to be reduced accordingly. Under such a trend, there is greater incentive to develop a flexible printed circuit (FPC) board that is light and thin, has high temperature resistance and other characteristics and may be mass produced. Flexible printed circuit boards may be found in various electronic products that are currently popular, such as mobile phones, liquid crystal displays, and organic light-emitting diodes. A flexible printed circuit board is produced by arranging circuits and other electronic components on a flexible copper clad laminate (FCCL), which, compared to a printed circuit board using a conventional silicon substrate or glass substrate, has better flexibility, and thus may also be referred to as a flexible board. Usually, a coverlay is applied to a surface of the flexible board as an insulation protection layer to protect copper circuits on the surface of the flexible board and improve the bending-proof performance of the circuit. A suitable material of the coverlay is required to have better heat resistance, dimensional stability, insulation performance, and chemical resistance. Polyimide (PI) has good insulation property and is excellent in physical properties such as ductility, coefficient of thermal expansion (CTE), heat resistance and chemical stability, and is therefore a commonly used coverlay material.

FIG. 1 shows a method conventionally known in the art for applying a coverlay to protect a copper circuit on the surface of a flexible board, comprising: (a) providing a film 10 comprising an insulating material layer 11, an adhesive layer 12 and a release layer 13; (b) processing the film into a predetermined shape; (c) removing the release layer 13, and aligning the film to a corresponding position of a flexible board 50; and (d) laminating the insulating material layer 11 onto the flexible plate 50 as a coverlay. The insulating material layer 11 is generally a synthesized and processed film, such as a polyimide film (PI film) which is uniaxially or biaxially stretched. Since the polyimide film needs to be stretched during its preparation process, the thickness thereof cannot be too thin; otherwise, the toughness would be greatly reduced and the stretch would be poor. Further, since the adhesion between the polyimide film and the flexible copper clad laminate that is commonly used as the flexible plate 50 is poor, an adhesive such as epoxy or acrylic adhesive needs to be used, which also increases the thickness of the coverlay. Therefore, a traditional coverlay is relatively thick (generally greater than 20 μm), which does not meet the current process requirements of being light and thin. In addition, in order to effectively cover the copper circuit, the adhesive layer needs to be able to flow at specific conditions to fill the recesses on the surface of the flexible board, since the surface of the flexible board is a patterned surface due to presence of the copper circuit thereon. The commonly used adhesive materials include epoxy resins, for example, those disclosed in US2006/0234045 (A1) or US2012/0015178 (A1). However, compared with polyimides, the epoxy resins in the adhesive layer have poor heat resistance and bendability.

In the above method, since it is necessary to use an adhesive with strong adhesion, the adhesive is difficult to dissolve and remove when an alignment error occurs, and reprocessing cannot be performed. In addition, due to the difference between the coefficients of thermal expansion between the adhesive layer, the insulating material layer and the flexible board, warpage is problematic. Moreover, to enable the adhesive layer to have a desirable flowability, the lamination step (d) in FIG. 1 generally takes place under high temperature and high pressure conditions, for example, under a pressure of 85-100 kg/cm$^2$ and at a temperature of 150-190° C. However, in this case it is likely to have a problem of glue overflow (glue bleeding). Another common problem is that when the film is laminated onto the patterned surface, there may be unwanted gas remaining therebetween, which will affect the reliability and quality of the final product. The problem can be avoided by using a vacuum lamination apparatus (for example, a vacuum laminator or a vacuum hot press machine) to discharge the air before lamination under pressure. However, in most cases, the method that uses the vacuum lamination apparatus can only achieve lamination in a single-sheet manner, i.e., a sheet by sheet manner. It is necessary to pause for a period of time after each lamination so as to remove a piece that has been laminated and replace it with another piece. The method that uses the vacuum lamination apparatus is time-consuming, fails to satisfy the objectives of a continuous process and rapid production, and is not cost-efficient due to the high cost of the apparatus In view of the above, there is a need in the art for a coverlay which can be processed through simple steps, is sufficiently thin and light for electronic products, and suffers no problems of glue overflow and failure in reprocessing caused by the adhesive.

SUMMARY OF THE INVENTION

The present invention provides a novel method for preparing a patterned polyimide coverlay on a substrate, with which the problems above can be solved.

The method of the present invention includes:
(a) providing a polyimide dry film including a carrier and a non-photosensitive polyimide layer on the carrier, the non-photosensitive polyimide layer containing
  (i) a polyimide precursor or soluble polyimide; and
  (ii) a solvent;
(b) forming a predetermined pattern on the polyimide dry film;
(c) laminating the patterned polyimide dry film onto a substrate in such a manner that the non-photosensitive polyimide layer of the patterned polyimide dry film faces the substrate; and
(d) forming a patterned polyimide coverlay by heating.

The method of the present invention includes preforming an opening on (pre-patterning) the polyimide dry film before lamination, and thus involves no exposure, development, or other complex steps such that a simple and cost effective process can be provided. Further, in the method of the present invention, the advantage that the adhesion between the polyimide precursor or soluble polyimide and the substrate (flexible board) is excellent is utilized, so the polyimide dry film of the present invention does not require the use of an adhesive, and no problem of glue overflow exists; the thickness of the non-photosensitive polyimide layer can be adjusted to reduce the thickness of the coverlay effectively, thus meeting the requirement of being sufficiently thin; and the obtained product also has preferred low warpage, heat resistance and bendability.

BRIEF DESCRIPTION OF THE DRAWINGS

The invention will be described according to the appended drawings, in which.

PREFERRED EMBODIMENT OF THE PRESENT INVENTION

Figure 1:
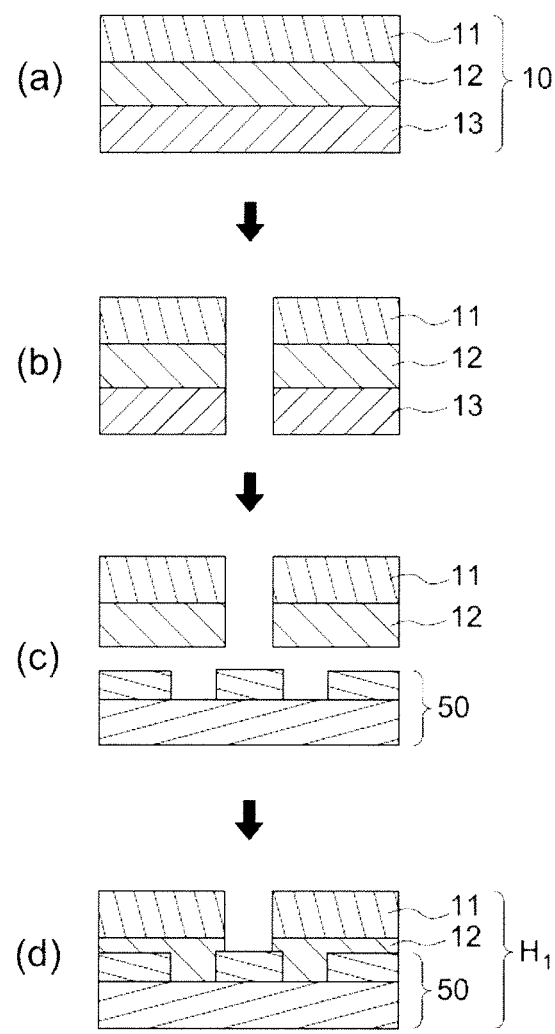
FIG. 1 is a schematic diagram of a conventional method for applying a coverlay to protect a copper circuit on a surface of a flexible board.

In order to facilitate the understanding of the disclosure herein, the terms are hereby defined below.

The term "about" refers to an acceptable deviation of a given value measured by a person of ordinary skill in the art, depending, in part, on how to measure or determine the value.

In the present invention, the term "alkyl" refers to a saturated, straight or branched hydrocarbon group, which comprises preferably 1-30 carbon atoms, and more preferably 1-20 carbon atoms. Examples include (but are not limited to) methyl, ethyl, n-propyl, isopropyl, n-butyl, isobutyl, tert-butyl, amyl, hexyl and similar groups.

In the present invention, the term "alkenyl" refers to an unsaturated, straight or branched hydrocarbon group containing at least one carbon-carbon double bond, which comprises preferably 2-30 carbon atoms, and more preferably 10-20 carbon atoms. Examples include (but are not limited to) ethenyl, propenyl, methyl propenyl, isopropenyl, pentenyl, hexenyl, heptenyl, 1-propenyl, 2-butenyl, 2-methyl-2-butenyl and similar groups.

In the present invention, the term "alkynyl" refers to an unsaturated, straight or branched hydrocarbon group containing at least one carbon-carbon triple bond, which comprises preferably 2-30 carbon atoms, and more preferably 10-20 carbon atoms. Examples include (but are not limited to) ethynyl, propargyl, 3-methyl-1-pentynyl, 2-heptynyl and similar groups.

In the present invention, the term "aryl" or "aromatic compound" refers to a 6-carbon monocyclic, 10-carbon bicyclic or 14-carbon tricyclic aromatic ring system. Examples include (but are not limited to) phenyl, tolyl, naphthyl, fluorenyl, anthryl, phenanthrenyl and similar groups.

In the present invention, the term "halogenated alkyl" refers to an alkyl substituted with a halogen, wherein the "halogen" denotes fluorine, chlorine, bromine or iodine, preferably fluorine or chlorine.

In the present invention, the term "alkoxy" refers to an alkyl attached to an oxygen atom. Examples include (but not limited to) methoxy, ethoxy, propoxy, isopropoxy, n-butoxy, isobutoxy, pentoxy, hexyloxy, benzyloxy, fluorenylmethoxy and similar groups.

In the present invention, the term "heterocyclyl" refers to a saturated, partially saturated (for example, those denominated with the prefix dihydro, trihydro, tetrahydro, hexahydro, or the like), or unsaturated 3 to 14-membered cyclyl containing carbon atoms and at least one heteroatom selected from N, O or S, preferably a 4 to 10-membered cyclyl, and more preferably a 5 or 6-membered cyclyl. The heterocyclyl preferably has 1 to 4 heteroatoms and more preferably 1 to 3 heteroatoms. The heterocyclyl may be a monocyclic, bicyclic or tricyclic ring system, including fused rings (for example, a fused ring formed together with another heterocyclic ring or another aromatic carbocyclic ring). Unless specifically indicated otherwise, in the present invention, the "heterocyclyl" may be substituted or unsubstituted. Examples of substituents include (but are not limited to) halo, hydroxyl, oxo, alkyl, hydroxyalkyl, —$NO_2$, and the like.

In the present invention, the term "nitrogen-containing heterocyclyl" refers to a 3 to 14-membered heterocyclyl with at least one ring carbon atom replaced by N, preferably a 4 to 10-membered nitrogen-containing heterocyclyl, and more preferably a 5 or 6-membered nitrogen-containing heterocyclyl. Examples include (but are not limited to) pyrrolyl, imidazolyl, pyrazolyl, pyrimidinyl, thiazolyl, pyridyl, indolyl, isoindolyl, benzimidazolyl, benzothiazolyl, quinolyl, isoquinolyl, and the like. Unless specifically indicated otherwise, in the present invention, the "nitrogen-containing heterocyclyl" may be substituted or unsubstituted. The substituents are as defined above for "heterocyclyl".

In the present invention, unless otherwise indicated specifically, the term "polyimide layer" refers to a resin layer containing a polyimide precursor that has not been cyclized or cured or soluble polyimide, and the aforementioned "polyimide" also includes polyetherimide (PEI). "Polyimide" may be a polyimide homopolymer or copolymer.

In the present invention, the term "dry film" is a term commonly used in the art and refers to a film obtained by applying a solvent-containing resin to a carrier by means of surface film-forming, and drying as desired. The resin layer of the dry film may optionally contain a solvent. Unlike a liquid resin material that is generally applied to a substrate by coating a flowable material thereon, the resin material of the dry film may be transferred to a substrate by lamination.

Polyimide Dry Film of the Present Invention

A photosensitive polyimide dry film may be used as a photoimageable coverlay (PIC) to protect a copper circuit on a surface of a flexible board. However, after the photosensitive polyimide dry film is laminated onto a flexible board, complex processing steps such as exposure, development, etching and others need to be conducted to form a desired opening, so the process is complex and expensive.

The method of the present invention does not involve a photo-imaging process. Therefore, the polyimide dry film of the present invention is not particularly limited to a photosensitive or non-photosensitive polyimide dry film. In a preferred embodiment of the present invention, a non-photosensitive polyimide dry film is used.

The polyimide dry film useful in the method of the present invention includes a carrier and a non-photosensitive polyimide layer on the carrier, where the non-photosensitive polyimide layer contains (i) a polyimide precursor or soluble polyimide; and (ii) a solvent.

1. Carrier

The carrier used in the present invention can be any carrier known to persons having ordinary skill in the art, such as glass or plastic. The plastic carrier is not particularly limited, which includes, for example, but is not limited to, polyester resins, such as polyethylene terephthalate (PET) and polyethylene naphthalate (PEN); polymethacrylate resins, such as polymethyl methacrylate (PMMA); polyimide resins; polystyrene resins; polycycloolefin resins; polyolefin resins; polycarbonate resins; polyurethane resins; triacetate cellulose (TAC); or a mixture thereof. The preferred carrier is polyethylene terephthalate, polymethyl methacrylate, polycycloolefin resin, or triacetate cellulose, or a mixture thereof. More preferably, the carrier is polyethylene terephthalate. The thickness of the carrier usually depends on the purpose of a desired electronic product and is preferably in the range from about 16 μm to about 250 μm.

2. Polyimide Layer

In a preferred embodiment of the present invention, a non-photosensitive polyimide dry film is used. The non-photosensitive polyimide dry film includes a non-photosensitive polyimide layer, where the non-photosensitive polyimide layer may contain a polyimide precursor or soluble polyimide, that is, the polyimide precursor or soluble polyimide has no photosensitive groups.

The thickness of the polyimide layer of the dry film of the present invention may be adjusted as desired according to the product, and is generally in the range of about 5 μm to about 60 μm, preferably in the range of about 10 μm to about 50 μm, and more preferably in the range of about 15 μm to about 40 μm.

The leveling property of the polyimide layer is affected by the glass transition temperature thereof. A high glass transition temperature leads to a poor leveling property of the polyimide layer. In this case, the lamination is difficult and gas bubbles that are unlikely to be dissolved are produced during the lamination process. A low glass transition temperature causes the polyimide layer to be sticky during the lamination process, and thus the operability is poor. According to an example of the present invention, the polyimide layer of the present invention has a glass transition temperature desirably in the range of −10° C. to 20° C., and preferably in the range of 0° C. to 15° C.

(a) Polyimide Precursor

There is no special limitation to the polyimide precursor used in the present invention, which may be well known by a person of ordinary skill in the art, such as a polyamic acid, a polyamic ester, any material capable of generating polyimide through reaction, or a mixture thereof. Various polyimide precursors have been developed in the art. For instance, those disclosed in ROC (Taiwan) Patent Application No. 095138481, No. 095141664, No. 096128743, No. 097151913 or No. 100149594, the content of which is hereby incorporated for reference in its entirety.

Polyimide precursor mainly has a repeating unit of formula (A):

Formula (A)

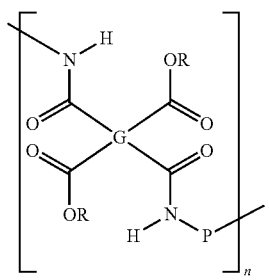

wherein
G is a tetravalent organic group;
P is a divalent organic group; and n is an integer greater than 0, and preferably an integer from 1 to 1000.

Optionally, the polyimide precursor may be modified with different substituents/groups. For example, a photosensitive polyimide precursor can be prepared by using photosensitive groups; the reactivity of a polyimide precursor or the properties of a polyimide prepared therefrom can be improved by adjusting the end groups bonded to the repeating unit of formula (A).

For example, ROC (Taiwan) Patent Application No. 100149594 discloses polyimide precursors having one of the repeating units of formulae (1) to (4):

(1)
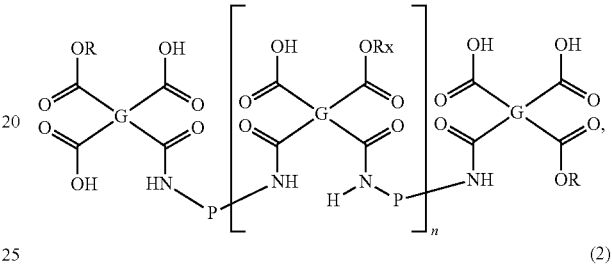

(2)
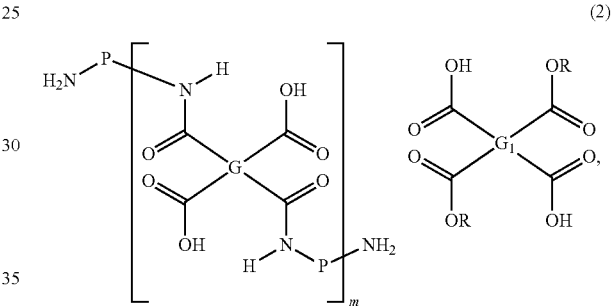

(3)
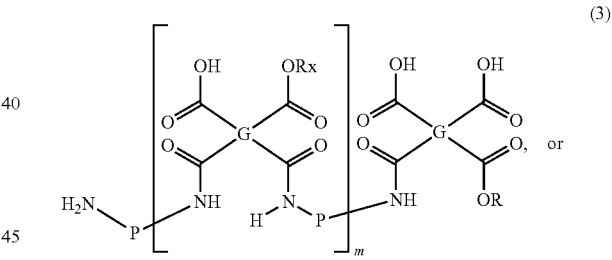

, or (4)
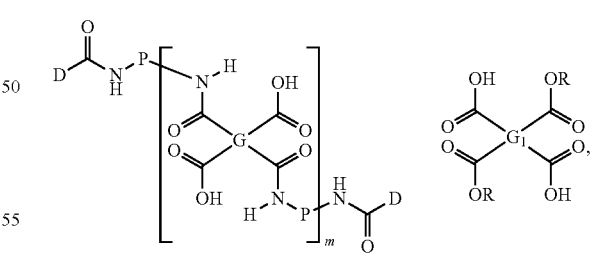

wherein $G_1$ independently represents a tetravalent organic group;
each RX independently represents H or an ethylenically unsaturated group;
each R independently represents $C_1$-$C_{14}$ alkyl, $C_6$-$C_{14}$ aryl, $C_6$-$C_{14}$ aralkyl, a phenolic group, or an ethylenically unsaturated group;
each D independently represents a nitrogen-containing heterocyclic group or an —OR* group, wherein R* is $C_1$-$C_{20}$ alkyl;

each m is an integer from 0 to 100, preferably an integer from 5 to 50, more preferably an integer from 10 to 25; and G and P are as defined as above.

The ethylenically unsaturated group is not particularly limited, examples thereof including, but not limited to, ethenyl, propenyl, methylpropenyl, n-butenyl, isobutenyl, ethenylphenyl, propenylphenyl, propenyloxymethyl, propenyloxyethyl, propenyloxypropyl, propenyloxybutyl, propenyloxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, a group of the following formula (5), and a group of the following formula (6):

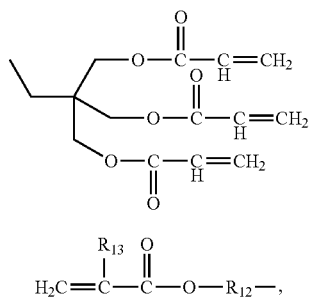

(5)

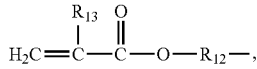

(6)

wherein $R_{12}$ is phenylene, $C_1$-$C_8$ alkylene, $C_2$-$C_8$ alkenylene, $C_3$-$C_8$ cycloalkylene or $C_1$-$C_8$ hydroxyalkylene; and $R_{13}$ is hydrogen or $C_1$-$C_4$ alkyl.

(b) Soluble Polyimide

Generally polyimide has the advantages of good heat and chemical resistance but suffers from the disadvantage of poor processability. Moreover, there are few solvents that can dissolve polyimide. Therefore, in use, a polyimide precursor is generally processed, and imidized into polyimide in a later stage of the process. A soluble polyimide is obtained by modify the structure of polyimide so as to increase the solubility of polyimide in a solvent and to improve the processability. The species of the solvent may be, for example, those described below.

The soluble polyimide of the present invention is not particularly limited and can be any conventional soluble polyimide known to a person of ordinary skill in the art such as those disclosed in ROC (Taiwan) Patent Application No. 097101740, No. 099105794, No. 097138725 or No. 097138792, the content of which is hereby incorporated for reference in its entirety.

The soluble polyimide of the present invention mainly has a repeating unit of formula (B):

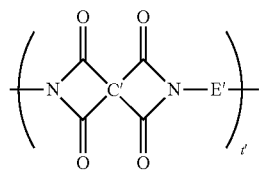

Formula (B)

wherein
C' is a tetravalent organic group;
E' is a divalent organic group; and
t' is an integer greater than 0, preferably an integer from 1 to 1000.

The tetravalent organic group C' has the same meaning as defined above for group G.

The divalent organic group E' has the same meaning as defined above for group P.

Optionally, the soluble polyimide may be modified with different substituents/groups. For example, a photosensitive polyimide can be prepared by using photosensitive groups. The properties of a soluble polyimide may be improved by adjusting the end groups bonded to the repeating unit of formula (B).

Modified soluble polyimide obtained by adjusting the end groups bonded to the repeating unit of formula (B) includes, but is not limited to,

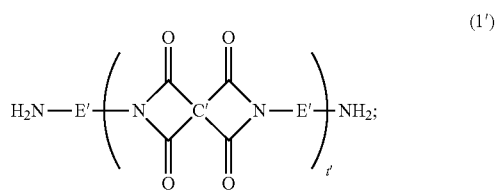

(1')

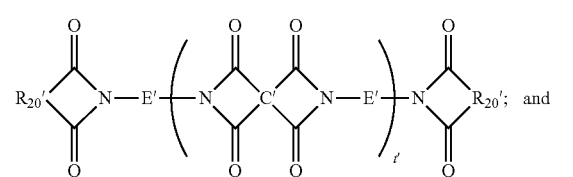

(2')

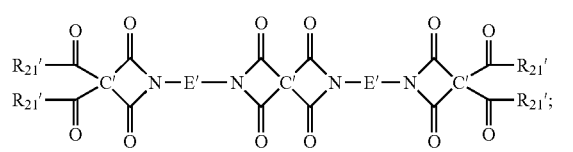

(3')

wherein
$R_{20}'$ is a saturated or unsaturated $C_2$-$C_{20}$ divalent organic group, preferably —C=C—,

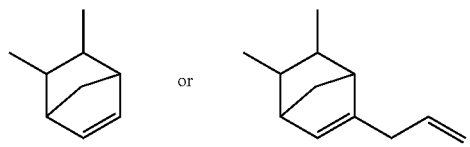

$R_{21}'$ is an unsaturated $C_2$-$C_{20}$ monovalent organic group which may be substituted by a heteroatom, or a —OH group; and
C', E' and t' are as defined above.

Preferably, the soluble polyimide modified by photosensitive groups includes, but is not limited to, those disclosed in ROC (Taiwan) Patent Application No. 099105794, No. 097138725, or No. 097138792.

(C) Solvent

Generally, the polyimide precursor and soluble polyimide are prepared or formulated in a polar aprotic organic solvent.

In the prior art, in order to prevent the dry film from generating a volatile organic compound in a high concentration during usage of the dry film and to reduce the phenomenon of excessive glue (bleeding) caused by the flowing of the coated glue (i.e., the resin layer) during storage of the dry film, a semi-product of the dry film that has been coated with the resin layer is sent to an oven for drying the resin layer and fully adhering the resin layer to the carrier. The organic solvent is almost completely volatilized at this step. Therefore, the content of the organic solvent in conventional dry film products is generally less than 1 wt %. In addition, the dry film product needs to be stored in a low-temperature environment, to reduce hydrolysis.

Unlike the prior art, the dry film of the present invention may contain a solvent. The total content of the solvent is not particularly limited, and may be adjusted as desired according to the manufacturing process or subsequent processing process of the dry film. In the present invention, the total content of the solvent is at least 5 wt %, and may range from 5 wt % to 70 wt %, for example, 5 wt %, 10 wt %, 15 wt %, 20 wt %, 25 wt %, 30 wt %, 35 wt %, 40 wt %, 50 wt %, 55 wt %, 60 wt %, 65 wt % and 70 wt %, preferably range from about 25 wt % to about 65 wt %, and more preferably range from about 35 wt % to about 60 wt %, based on the total weight of the non-photosensitive polyimide layer. The inventors of the present invention have found that when the total content of the solvent is at least 5% by weight based on the total weight of the resin layer, the dry film has a bubble-dissolving effect or has water absorbability. In a dry lamination process, the dry film of the present invention allows the air between the substrate and the dry film to be dissolved in the solvent of the dry film. When applied in a wet lamination process, because the polyimide dry film of the present invention may comprise a hydrophilic solvent miscible with water, the polyimide dry film of the present invention is relatively stable in nature even in the presence of water, and has a non-sticky surface, and a good transfer capability; and the polyimide cured therefrom has good physical properties. Therefore, the storage stability of the dry film is increased, and the dry film is applicable to a process in which water or an aqueous solution is involved. Thus, by means of the dry film of the present invention, the problem of bubbles generated when the coverlay is laminated onto a flexible printed circuit board in the prior art can be solved effectively without the use of an expensive vacuum lamination apparatus.

In an example of the present invention, when the solvent content is too low (for example, lower than 15 wt %, or even lower than 5 wt %), the dry film trends to be brittle, and is difficult to laminate onto the flexible board, such that the bubble dissolving effect is poor during the lamination process and rebubbling may occur easily, or the water absorbability of the polyimide dry film and the adhesion of the polyimide dry film to the flexible board are poor. However, when the solvent content is too great, especially greater than 70 wt %, the film formation of the polyimide layer of the dry film is poor, the surface of the dry film is sticky, the operability is poor, and an preferable bubble removal effect cannot be achieved during the lamination process as expected.

The type of solvent used in the present invention is not particularly limited. According to an example of the present invention, the solvent useful in the present invention includes dimethyl sulfoxide (DMSO), diethyl sulfoxide, phenol, o-cresol, m-cresol, p-cresol, xylenol, halogenated phenol, pyrocatechol, tetrahydrofuran (THF), dioxane, dioxolane, propylene glycol monomethyl ether (PGME), tetraethylene glycol dimethyl ether (TGDE), 2-butoxyethanol, γ-butyrolactone (GBL), xylene, toluene, hexamethylphosphoramide, propylene glycol monomethyl ether acetate (PGMEA),

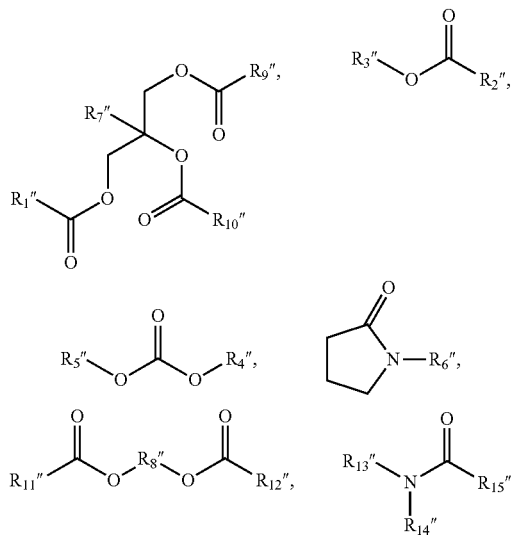

mixture thereof, where $R_1''$, $R_9''$ and $R_{10}''$ each independently represent $C_1$-$C_{20}$ alkyl, $C_2$-$C_{20}$ alkenyl, or $C_2$-$C_{20}$ alkynyl;

$R_7''$ is H or $C_1$-$C_3$ alkyl;

$R_2''$ is $C_1$-$C_{10}$ alkyl;

$R_3''$ is $C_4$-$C_{20}$ alkyl or —$C_2$-$C_{10}$ alkyl-O—$C_2$-$C_{10}$ alkyl;

$R_4''$ and $R_5''$ each independently represent $C_1$-$C_{10}$ alkyl, or $R_4''$ and $R_5''$, together with the oxygen atoms to which they are attached, form a 5 to 6-membered heterocyclic ring;

$R_6''$ is $C_1$-$C_{15}$ alkyl, $C_2$-$C_{20}$alkenyl, $C_4$-$C_8$ cycloalkyl, or

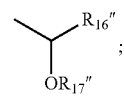

$R_8''$ is $C_2$-$C_{10}$ alkylene;

$R_{11}'$ and $R_{12}''$ each independently represent $C_1$-$C_{10}$ alkyl;

$R_{13}''$ and $R_{14}''$ each independently represent $C_1$-$C_{10}$ alkyl, or $R_{13}''$ and $R_{14}''$, together with the nitrogen atom to which they are attached, form a 5 to 6-membered heterocyclic ring;

$R_{15}''$ is H, $C_1$-$C_{15}$ alkyl, or $C_4$-$C_8$ cycloalkyl;

$R_{16}''$ is $C_1$-$C_4$ alkyl; and $R_{17}''$ is $C_4$-$C_{10}$ alkyl.

Examples of solvents having the structure

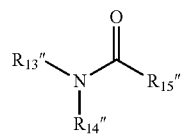

include, but are not limited to, N,N-dimethylformamide, N,N-diethylformamide, N,N-dimethylacetamide, N,N-diethylacetamide, or N,N-dimethylcapramide (DMC).

Examples of solvents having the structure

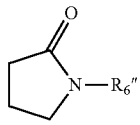

include, but are not limited to, N-methyl-2-pyrrolidone (NMP), N-vinyl-2-pyrrolidone, N-ethyl-2-pyrrolidone (NEP), N-propyl-2-pyrrolidone, or N-octyl-2-pyrrolidone (NOP).

According to an embodiment of the present invention, the useful solvent preferably includes diethyl sulfoxide, N,N-dimethylformamide, N,N-diethylformamide, N,N-dimethylacetamide, N,N-diethylacetamide, N,N-dimethylcapramide, N-methyl-2-pyrrolidone, N-ethyl-2-pyrrolidone, N-propyl-2-pyrrolidone, propylene glycol monomethyl ether, γ-butyrolactone, propylene glycol monomethyl ether acetate,

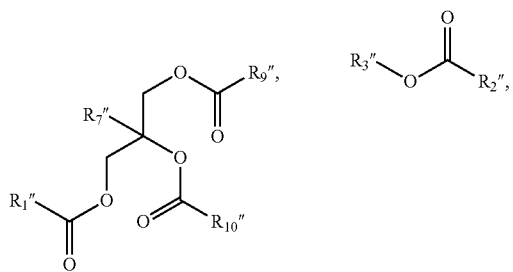

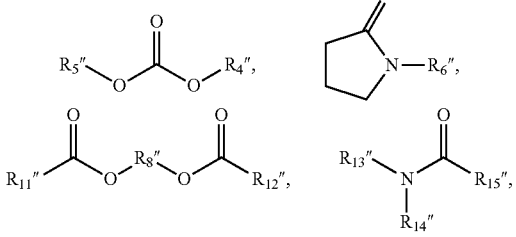

or a mixture thereof, where $R_1''$ to $R_{15}''$ are as defined above; and more preferably includes N,N-dimethylformamide, N-methyl-2-pyrrolidone, N-ethyl-2-pyrrolidone, γ-butyrolactone,

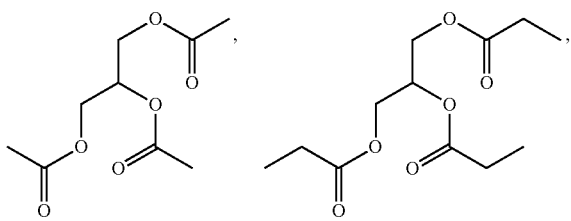

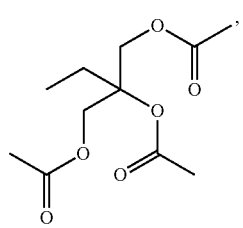

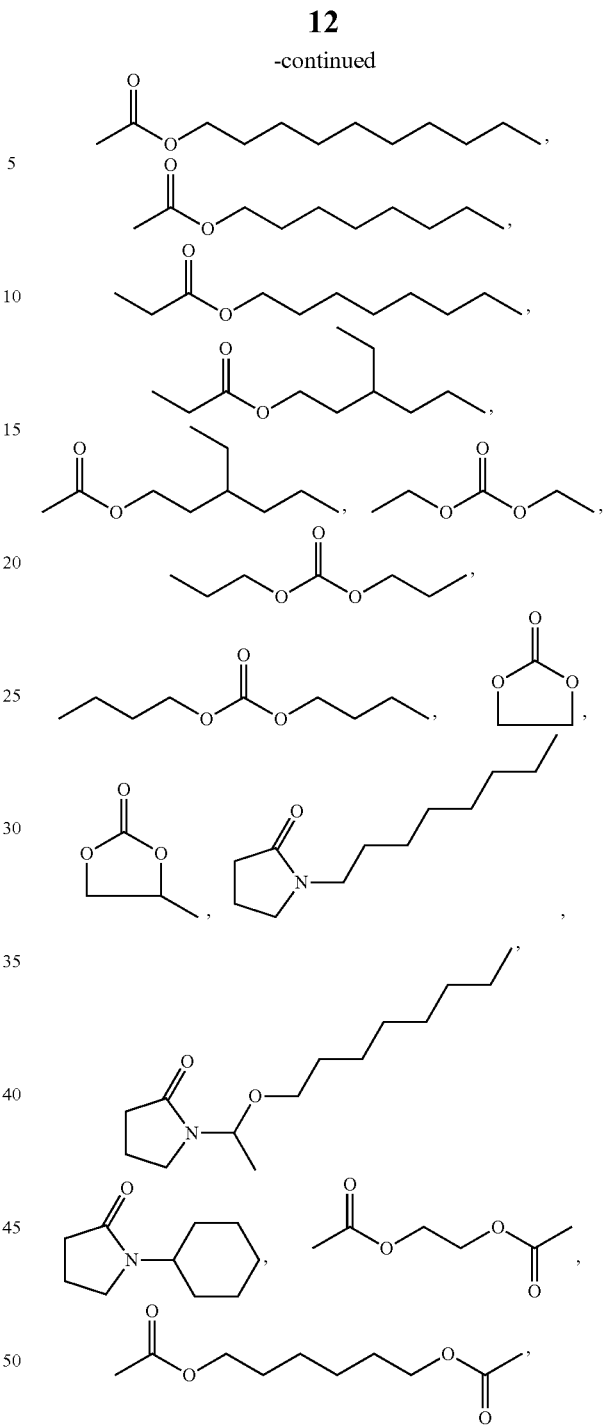

N,N-dimethylcapramide, or a mixture thereof.

(d) Additive

The polyimide layer of the present invention may optionally contain any suitable additives conventionally known to persons of ordinary skill in the art, which for example, but are not limited to, a stabilizer, a ring closing promoter, a leveling agent, a deforming agent, a coupling agent, a catalyst, and so on. The content of the additives can also be adjusted by persons of ordinary skill in the art via routine experiments.

In an embodiment of the present invention, the polyimide layer of the present invention may optionally contain a stabilizer selected from:

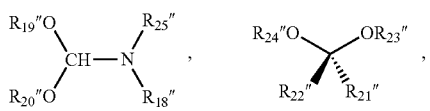

or a combination thereof,
wherein:
$R_{25}''$, $R_{18}''$, $R_{19}''$ and $R_{20}''$ each independently represent H, $C_1$-$C_4$ alkyl or $C_6$-$C_{14}$ aryl, or $R_{19}''$ and $R_{20}''$, together with the oxygen atoms to which they are attached, form a 5 to 6-membered heterocyclic ring, or $R_{19}''$ and $R_{25}''$ or $R_{20}''$ and $R_{18}''$, together with the oxygen atom and nitrogen atom to which they are attached, form a 5 to 6-membered heterocyclic ring, or $R_{25}''$ and $R_{18}''$, together with the nitrogen atom to which they are attached, form a 5 to 6-membered heterocyclic ring;

$R_{21}''$ and $R_{22}''$ each independently represent $C_1$-$C_4$ alkyl or $C_6$-$C_{14}$ aryl, or $R_{21}''$ and $R_{22}''$, together with the carbon atom to which they are attached, form a 5 to 6-membered carbocyclic ring; and $R_{23}''$ and $R_{24}''$ each independently represent $C_1$-$C_4$ alkyl.

According to a preferred embodiment of the present invention, the stabilizer preferably includes:

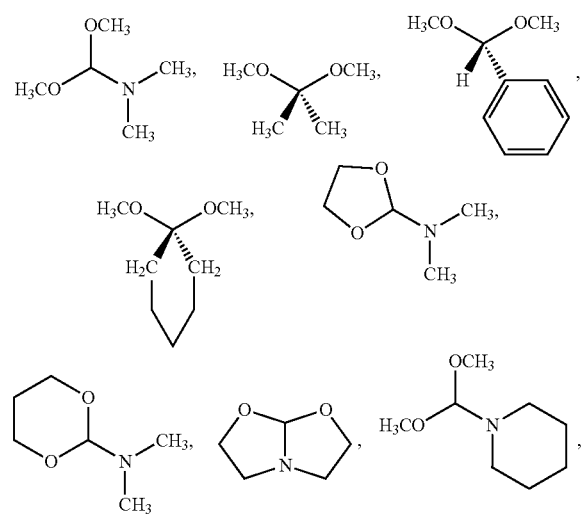

or a combination thereof.

Addition of the stabilizer is beneficial to increase the stability and operability of the dry film and further improves the physical properties of polyimide formed subsequently. In an embodiment of the present invention, the total content of the stabilizer is in the range of about 0.01 wt % to about 5 wt %, and preferably in the range of about 0.05 wt % to about 3 wt %, based on the total weight of the non-photosensitive polyimide layer. If the content is greater than 5 wt %, the physical properties (for example, flexibility) of the formed polyimide may deteriorate.

According to one embodiment of the present invention, the polyimide layer of the present invention may optionally contain a metal adhesion promoter. The metal adhesion promoter (such as copper adhesion promotor) can form a complex with copper foil, thereby enhancing the adhesion between polyimide resin layer and copper circuit.

The metal adhesion promoter can be N-containing heterocycles, for example, 5 to 6-membered heterocycles containing 1 to 3 nitrogen atoms, such as imidazoles, pyridines or triazoles; or fused ring compounds containing any of the above-mentioned N-containing heterocycle in structure. The above N-containing heterocycles can be unsubstituted or substituted by one to three substituent groups. The substituent group can be, for example, but is not limited to hydroxyl or 5 to 6-membered heterocyclyl containing 1 to 3 nitrogen atoms. According to one embodiment of the present invention, the metal adhesion promoter, if present, is in an amount of about 0.1 wt % to about 5 wt %, preferably in an amount of 0.5 wt % to about 2 wt %, based on the total weight of the non-photosensitive polyimide layer.

Examples of the metal adhesion promoter include, but are not limited: 1,2,3-triazole, 1,2,4-triazole, 3-amino-1,2,4-triazole, 3,5-diamino-1,2,4-triazole, imidazole, benzimidazole, 1,2,3,4-tetrahydrocarbazole, 2-hydroxybenzimidazole, 2-(2-hydroxyphenyl)-1H-benzimidazole, 2-(2-pyridyl)-benzimidazole, 2-(3-pyridyl)-1H-benzimidazole or a combination thereof.

The coupling agent useful in the present invention may be selected from a group consisting of (but not limited thereto): 3-aminopropyltrimethoxysilane (APrTMOS), 3-triaminopropyltriethoxysilane (APrTEOS), 3-aminophenyltrimethoxysilane (APTMOS), 3-aminophenyltriethoxysilane (APTEOS), and a combination thereof.

According to an embodiment of the present invention, when the polyimide layer of the dry film of the present invention contains the polyimide precursor, a ring closing promoter may be optionally added to the polyimide layer. Preferably, a ring closing promoter is selected from the one that can produce an alkaline compound upon heating, to provide an alkaline environment for promoting the progress of imidization. The ring closing promoter useful in the present invention includes:

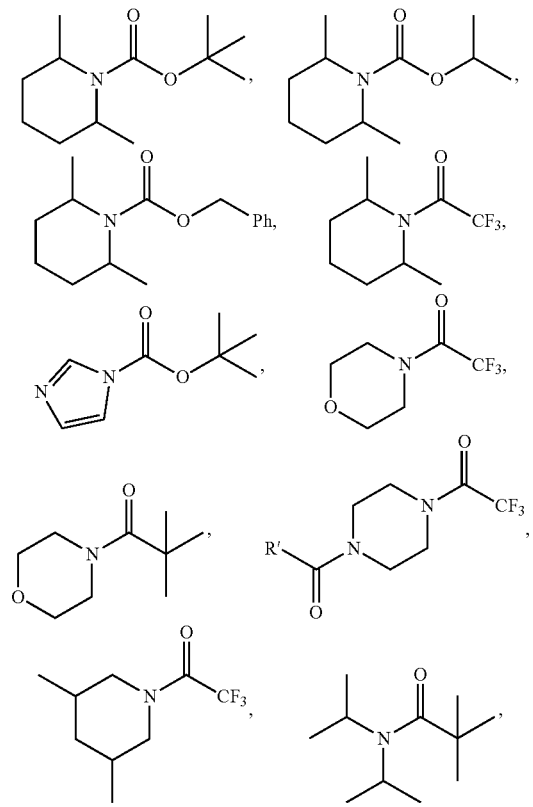

-continued

[Chemical structures of imidazolium cations with Y⁻ anions]

wherein $Y^\ominus$ is an anionic group.

Method for Forming a Dry Film

The polyimide dry film of the present invention may be prepared, for example, by the following steps:

(1) preparing a polyimide formulation, containing a polyimide precursor or soluble polyimide and a solvent;

(2) applying the formulation obtained in step (1) onto a carrier, to form a dry film semi-product;

(3) putting the dry film semi-product into an oven to heat and dry it so as to remove a portion of the solvent, to adjust the content of the solvent in the polyimide layer, and form a polyimide dry film; and (4) optionally, applying a protection film to the polyimide layer of the polyimide dry film.

In step (3), the heating temperature and time are not particularly limited and the main purpose thereof is to reduce the solvent content in the resin layer. For example, the heating and drying may be conducted at a suitable temperature between 60 to 150° C. for 30 seconds to 10 minutes. In a conventional process for preparing the dry film, in order to prevent the dry film from generating a volatile organic compound at high concentration during use of the dry film, the solvent is almost completely volatilized by heating (to a content of less than 1 wt %) in a solvent removal step corresponding to step (3) above. However, in contrast to the conventional step, the solvent is not completely removed in this step in the present invention, and a suitable amount of the solvent is retained in the dry film.

The solvent in step (1) or (3) is as described above, and may be used alone or in a combination of two or more solvents. Generally, due to the difference in boiling points of different solvents, the total amount and proportion of the solvents in the desired dry film can be controlled by properly adjusting the heating temperature and time.

The protection film in step (4) includes, for example, but is not limited to, polyester resins, for example, polyethylene terephthalate (PET) or polyethylene naphthalate (PEN); polymethacrylate resins, for example, polymethyl methacrylate (PMMA); polyimide resins; polystyrene resins; polycycloolefin resins; polyolefin resins; polycarbonate resins; polyurethane resins; triacetate cellulose (TAC); or a mixture thereof. Preferably, the protection film is polyethylene terephthalate, polymethyl methacrylate, polycycloolefin resins, triacetate cellulose or a mixture thereof. More preferably, the protection film is polyethylene terephthalate.

Application of the Dry Film of the Present Invention

The dry film of the invention has bubble-dissolving (or gas-dissolving) and water absorption effects, and can effectively reduce the gas existing between the dry film and the substrate without the use of a vacuum lamination apparatus. Therefore, the dry film of the present invention may be laminated onto a substrate, such as a printed circuit board, a wafer, glass, a display or a touch panel, by using a general lamination technique (particularly roller lamination in a wet process), without the use of a high pressure degassing machine or a vacuum lamination apparatus. Accordingly, the present invention has a higher yield and is more cost-efficient than the prior art which adopts a vacuum lamination apparatus or other process apparatuses. Therefore, the operation can be accomplished with simple process steps in comparison with the prior art, and the apparatus used is also more readily available than that used in the prior art.

The dry film of the present invention is applicable to printed circuit boards, and serves as a coverlay for protecting the coatings on the printed circuit boards, which is electrically insulated and can protect the circuits and achieve excellent effects such as the prevention of circuit oxidation and solder short. Moreover, the dry film of the invention can effectively reduce the gas existing between the resin layer and the substrate without the use of a vacuum lamination apparatus, thereby enhancing product quality.

For the dry film that is applied to a printed circuit board or a wafer as a coverlay or a passivated layer in the prior art, a bottleneck exists in mass commercial production, because of the excessively high investment cost for the vacuum lamination apparatus, the long preparation period, and the slow production rate. By means of the solvent-containing dry film of the present invention, undesired gas can be easily removed without the use of a vacuum lamination apparatus. Thus, it is possible to apply the dry film of the present invention to a printed circuit board, a wafer or even a display or touch panel, as well as other fields, in a simpler and more cost-effective manner.

Method for Preparing a Patterned Polyimide Coverlay on a Substrate

As described above, to solve the problem existing in the prior art, the present invention provides a novel method for preparing a patterned polyimide coverlay on a substrate, which comprises:

(a) providing a polyimide dry film including a carrier and a non-photosensitive polyimide layer on the carrier, the non-photosensitive polyimide layer containing
 (i) a polyimide precursor or soluble polyimide; and
 (ii) a solvent in an amount of at least 5 wt % based on the total weight of the non-photosensitive polyimide layer;

(b) forming a predetermined pattern on the polyimide dry film;

(c) laminating the patterned polyimide dry film to a substrate in such a manner that the non-photosensitive polyimide layer of the patterned polyimide dry film faces the substrate; and (d) forming a patterned polyimide coverlay by heating.

Figure 2:
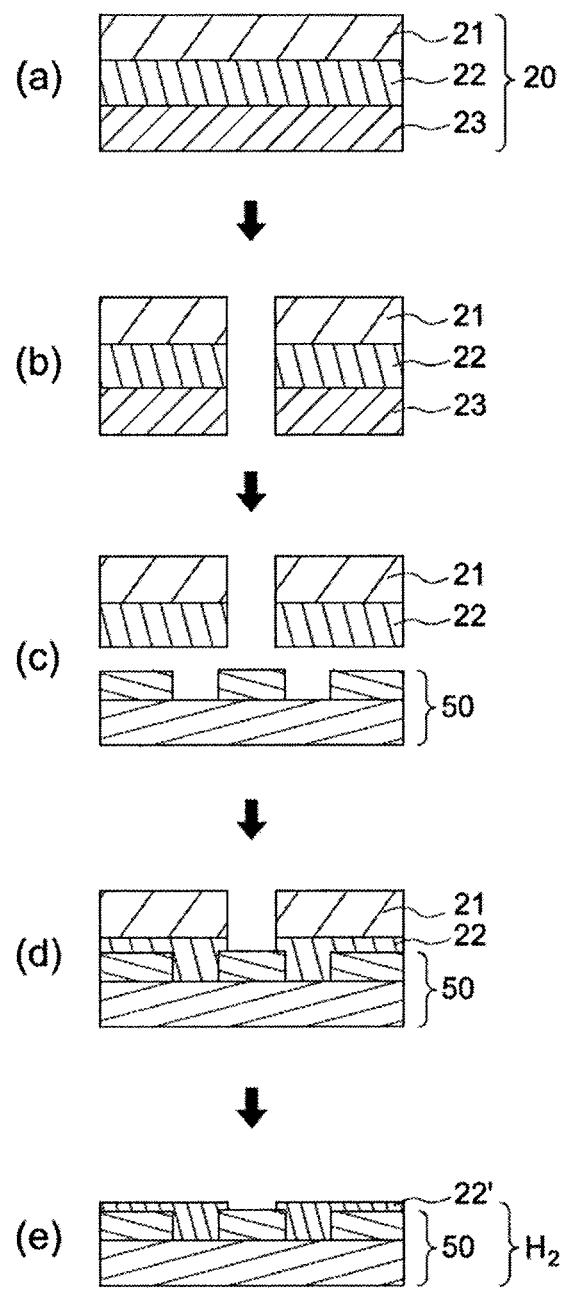
FIG. 2 is a schematic diagram of a method for preparing a patterned polyimide coverlay on a substrate according to an example of the present invention.

FIG. 2 is a schematic diagram of a method for preparing a patterned polyimide coverlay on a substrate according to an example of the present invention. The method of the present invention is described in further detail with reference to FIG. 2.

As shown in FIGS. 2(a) and (b), in the method of the present invention, a polyimide dry film 20 including a carrier 21, a non-photosensitive polyimide layer 22 and an optional protection film 23 is provided first (step (a) of the method of the present invention), and a predetermined pattern is formed on the polyimide dry film (step (b) of the method of the present invention). As shown in FIG. 2(c), after the protection film 23 is peeled off, the patterned polyimide dry film is aligned to a corresponding position of a substrate 50. Then, as shown in FIG. 2(d), the patterned polyimide dry film is laminated onto the substrate 50 in a manner such that the non-photosensitive polyimide layer 22 of the patterned polyimide dry film faces the substrate 50 (step (c) of the method of the present invention), and the carrier 21 is removed. Finally, a patterned polyimide coverlay 22' is formed by heating, as shown in FIG. 2(e).

Figure 3:
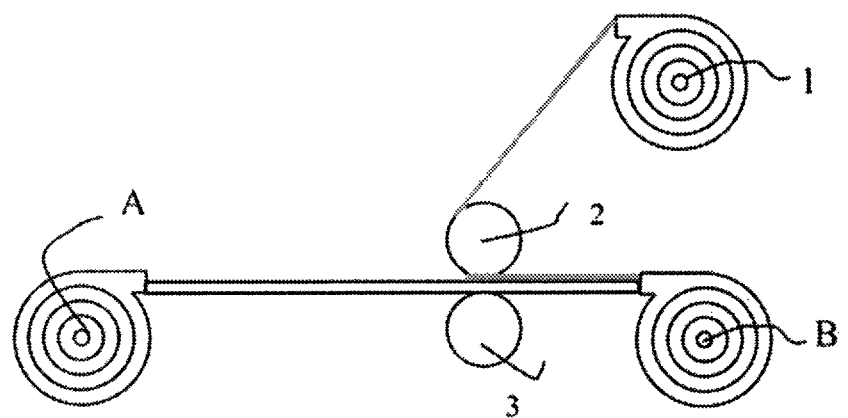
FIG. 3 is a schematic diagram of a roll-to-roll process.

The method of the present invention (any step or as a whole) can be operated in a roll-to-roll manner. A roll-to-roll operation, which is known to a person of ordinary skill in the art, refers to the steps of drawing out a sample from a rolled-up material, processing the sample, and winding the processed sample into a roll. The lamination in step (c) is taken as an example, in which a substrate A is drawn out from a roll of the substrate A, laminated with a dry film from a dry film roll 1 by using rollers 2 and 3 (e.g., roller lamination), and then wound to form a product B, as shown in FIG. 3. The dry film from the dry film roll 1 has been formed with a predetermined pattern in a previous step (that is, step (b)). The dry film of the present invention may be laminated onto the substrate by a continuous process, which is favorable for simplifying and speeding up the process.

In step (b), the predetermined pattern may be formed by mechanical punching or laser drilling, whereby the polyimide dry film has an opening corresponding to the circuit on the substrate. Then, the polyimide dry film is aligned to the corresponding position of the substrate.

The substrate may include a printed circuit board, a wafer, a display, a touch panel or other substrates with a patterned surface. According to an example of the present invention, the substrate is a printed circuit board, and particularly preferably a flexible printed circuit (FPC).

The lamination process in step (c) includes roller lamination, hot press, vacuum lamination, or vacuum press, and may be a dry process or a wet process.

The dry process includes roller lamination or hot press. If the lamination is carried out without the use of a vacuum apparatus, there may still be undesired gas remaining between the patterned circuit board and the polyimide dry film. In order to remove the undesired gas, bubble dissolution under pressure, which is well known to those of ordinary skill in the art, is optionally carried out after lamination, to facilitate the air remaining between the substrate and the resin layer to dissolve in the resin layer rapidly. By way of example, the substrate to which the dry film has been applied is preferably wound into a roll, and then the whole roll is fed to a pressurized degassing (bubble dissolving) machine for bubble dissolution. The pressurization is preferably continued for 10 to 60 minutes at 30 to 100° C. under 2 to 10 atmospheres.

The wet process includes roller lamination, in which a liquid (which is generally water or an aqueous solution) is applied onto a surface to be laminated first, to fully fill recessed areas on the surface, and thus discharge the air existing between the polyimide dry film and the surface to be laminated. The wet process is advantageous in improving the conformability of the dry film to the patterned substrate.

Because polyimide and a precursor thereof (for example, polyamic acid or polyamic ester) is susceptible to hydrolysis, which causes chain scission or premature imidization and produces undesired low-molecular-weight polyimide precipitates, thereby affecting the quality of the resulting coverlay. Accordingly, it has been considered in the art that the polyimide dry film generally needs to be stored or processed at a low temperature or in an environment without water, and thus is not suitable for use in a wet lamination process. However, the polyimide dry film of the present invention may contain a hydrophilic solvent miscible with water and has not only water absorbability, but also a non-stick surface; the polyimide dry film of the present invention has good compatibility with water or an aqueous solution and is relatively stable even in the presence of water, and therefore, the properties of the obtained polyimide are not affected.

In a preferred example of the present invention, a wet process is used and the polyimide dry film of the present invention contains a hydrophilic solvent that is miscible with a liquid (water or an alcohol). The hydrophilic solvent useful in the present invention includes dimethyl sulfoxide (DMSO), diethyl sulfoxide, N,N-dimethyl-formamide (DMF), N,N-diethyl-formamide, N,N-dimethylacetamide (DMAc), N,N-diethylacetamide, N-methyl-2-pyrrolidone (NMP), N-ethyl-2-pyrrolidone (NEP), N-propyl-2-pyrrolidone, N-vinyl-2-pyrrolidone, phenol, o-cresol, m-cresol, p-cresol, xylenol, halogenated phenol, pyrocatechol, tetrahydrofuran (THF), dioxane, dioxolane, propylene glycol monomethyl ether (PGME), tetraethylene glycol dimethyl ether (TGDE), 2-butoxyethanol, γ-butyrolactone (GBL), xylene, toluene, hexamethylphosphoramide, and propylene glycol monomethyl ether acetate (PGMEA), or a mixture thereof.

According to an embodiment of the present invention, the hydrophilic solvent used preferably includes diethyl sulfoxide, N,N-dimethyl-formamide, N,N-diethyl-formamide, N,N-dimethylacetamide, N,N-diethylacetamide, N-methyl-2-pyrrolidone, N-ethyl-2-pyrrolidone, N-propyl-2-pyrrolidone, propylene glycol monomethyl ether, γ-butyrolactone, propylene glycol monomethyl ether acetate, or a mixture thereof; and more preferably, includes N,N-dimethyl-formamide, N-methyl-2-pyrrolidone, N-ethyl-2-pyrrolidone, γ-butyrolactone, or a mixture thereof.

In a preferred example of the present invention, the lamination process used in step (c) is a wet roller lamination process, in which a roll-to-roll operation is used. The lamination temperature and pressure are not particularly limited. The lamination temperature is preferably in the range of 50° C. to 140° C., and the lamination pressure is preferably in the range of 0.1 kg/cm$^2$ to 15 kg/cm$^2$.

The polyimide layer of the dry film of the present invention is a polyimide precursor (e.g., polyamic acid) which has not yet been cyclized or cured, or a soluble polyimide. Therefore, compared with a uniaxially or biaxially stretched polyimide product that has been used to prepare a coverlay in the art, the polyimide layer of the dry film of the present invention is relatively soft, and can fill recesses on the surface of a patterned substrate with the application of moderate pressure. This purpose can be achieved without additional use of an adhesive layer, at relatively low lamination temperature and pressure, and without obvious glue overflow. Furthermore, in case of alignment error, the polyimide precursor and soluble polyimide can be removed by adding a solvent, which facilitates the reprocessing.

In step (d), a desired patterned polyimide coverlay is formed by heating. The solvent contained in the polyimide layer and/or a liquid (water or an alcohol) that is miscible with the solvent and/or air dissolved upon lamination in the polyimide layer can be removed in this step. Moreover, when the polyimide layer contains a polyimide precursor, the polyimide precursor is cyclized and polymerized to form polyimide in this step. The heating temperature and time in step (d) are not particularly limited and may be optionally adjusted, as long as they are sufficient for achieving the above purposes. According to an example of the present invention, the heating is carried out with an oven or IR light in step (d). The heating time can be reduced by the use of IR light, thus increasing process efficiency.

The uniaxially or biaxially stretched polyimide product used in the preparation of a coverlay in the art has a certain thickness (for example, 10 μm to 200 μm as disclosed in US2012/0015178(A1)), and the adhesive layer also has a certain thickness (for example, 5 μm to 50 μm as disclosed in US2012/0015178(A1)) for providing sufficient adhesion and effectively filling the recesses on the patterned substrate, so the coverlay prepared in the art may have a thickness ranging from about 15 μm to 250 μm. In the method of the present invention, no adhesive layer needs to be used, and the polyimide layer contains a polyimide precursor or soluble polyimide and a solvent, so the thickness of the polyimide coverlay can be easily adjusted, if needed (for example, by adjusting the amount of polyimide precursor or soluble polyimide or the thickness of the polyimide layer of the polyimide dry film) and the desired polyimide coverlay can be formed after volatilizing the solvent by heating. Therefore, thinning is achieved and a thin coverlay is prepared. According to an example of the present invention, the thickness of the coverlay obtained in step (d) is from 2 μm to 30 μm, for example, about 2, 3, 5, 7, 9, 10, 11, 12, 13 or 14 μm, preferably not greater than 20 μm, and more preferably not greater than 15 μm. Compared with the technology for preparing a coverlay in the art, the coverlay prepared by the method of the present invention has the advantages of easy operation, high yield, and easy reprocessing. Moreover, by means of the method according to the present invention, the thickness can be adjusted to prepare a thinner coverlay. Even when the method of the present invention is used to prepare a coverlay having a thickness comparable to that of a conventional coverlay, the coverlay of the present invention does not contain an adhesive, is a single-layer polyimide structure, and thus provides better insulation.

In the method of the present invention, no adhesive needs to be used, thus alleviating the problems of warpage and glue overflow, and producing a coverlay that has better heat resistance and bendability, and can be effectively adhered to the substrate.

The examples below are provided for further illustrating rather than limiting the scope of the present invention. Modifications and changes readily made by persons of skill in the art are contemplated in the disclosure of the specification and the protection scope of the claims of the present invention.

EXAMPLES

Preparation Example

1. Synthesis of Non-Photosensitive Polyimide Precursor Resin PAA-1

15.23 (0.052 mol) 4,4'-Biphthalic dianhydride (referred to hereinafter as BPDA) was dissolved in 100 g N-methyl-2-pyrrolidone (referred to hereinafter as NMP) and 0.959 g (0.013 mol) n-butanol and 0.48 g (0.006 mol) 1-methylimidazole were added dropwise. The solution was stirred at a fixed temperature of 60° C. for 2 hrs to carrying out the reaction. 82.88 g (0.259 mol) 2,2'-bis(trifluoromethyl) benzidine and 300 g NMP were added to the solution at 10° C., stirred for 0.5 hr, and then 60.92 g (0.207 mol) BPDA and 200 g NMP were added and stirred at 10° C. After 4 hrs, the temperature was increased to 60° C. and the reaction was carried out for 8 hrs with stirring. Finally, 0.83 g (0.006 mol) ethyl trifluoroacetate was added and stirred for 1 hr. Then, 0.22 g 5-aminotetrazole and 24 g NMP were added at room temperature and stirred for 1 hr, to obtain a polyimide precursor resin PAA-1 having a solid content of about 20 wt %.

2. Preparation of a Dry Film 100 parts by weight of the PAA-1 solution was evenly applied on a polyethylene terephthalate (PET; R310, manufactured by Mitsubishi Chemical) carrier by using a blade coater, and baked at a line feed speed of 0.45 m/min in an oven having a length of 1 meter, at a temperature of 90° C. Then, a release film (Model L150L, manufactured by Nan Ya Plastics Corporation) was applied to the surface coated with the PAA-1 layer, to obtain a dry film. After baking, the coating thickness was about 30 μm, and the solvent content in the dry film was 40 wt % based on the total weight of the PAA-1 layer.

Example 1: Wet Lamination

A 20*20 cm sheet was taken from the dry film prepared in the preparation example and a round hole of ¼" (that is, about 6.35 mm in diameter) was punched out of the sheet by using a mechanical punching machine, and then the release film was removed.

A 20*20 cm copper clad laminate (L/S=30/30 μm; L/S=line width/line spacing; thickness 12.7 μm) on which a circuit was fabricated was provided. Deionized water was applied onto the surface (which has a circuit formed thereon) of the copper clad laminate, and the sheet was adhered to the copper clad laminate using hot rollers at a temperature of 80° C. and under a pressure of 5 kg/cm$^2$ in such a manner that the polyimide precursor layer faces the surface of the copper clad laminate having the circuit. The PET film was peeled off, and then the sample was placed in a nitrogen oven, and baked by heating for 1 hr at 170° C. and then for 2 hrs at 350° C., to prepare a circuit board FPC-1 with patterned polyimide coverlay.

Example 2: Dry Lamination

The method is the same as that in Example 1, except that no deionized water was applied onto the surface (which has a circuit formed thereon) of the copper clad laminate. A circuit board FPC-2 with patterned polyimide coverlay was prepared.

Comparative Example

An epoxy resin was evenly coated onto a polyimide film (KAPTON®, thickness: 12.7 μm) by using a coating machine, and baked by heating at 80° C. for 3 hrs, to prepare an adhesive-containing dry film of 15 μm, and then covered with a release film (Model L150L, manufactured by Nan Ya Plastics Corporation)

A 20*20 cm sheet was taken from the dry film prepared above and a round hole of ¼" (that is, about 6.35 mm in diameter) was punched out of the sheet by using a mechanical punching machine, and then the release film was removed.

A 20*20 cm copper clad laminate (L/S=30/30 μm; L/S=line width/line spacing; thickness 12.7 μm) on which a circuit was fabricated was provided. The sheet was adhered to the copper clad laminate in such a manner that the epoxy resin faces the surface of the copper clad laminate having the circuit, and then laminated for 30 min by a vacuum press machine at 170° C. and under a pressure of 100 kg/cm$^2$, to form a circuit board FPC-3 having patterned polyimide coverlay.

<Test Methods>

1. Test of Solvent Content in the Dry Film 0.01 g polyimide precursor coating (excluding the PET carrier) of the dry film prepared in the preparation example was dissolved in dimethyl sulfoxide (DMSO). A 7890GC gas chromatograph manufactured by Agilent Technologies Co., Ltd., with the column model: DB1701 (0.53 mm, 30 mm, 1.5 μm), was used to implement quantitative gas chromatography.

2. Thickness Test

The thickness (see $H_1$ in FIG. 1 and $H_2$ in FIG. 2) of the circuit boards prepared in the examples and comparative example was measured by using a film thickness gauge.

3. Glue Overflow Test

Whether glue overflow occurred at the opening of the coverlay on the circuit boards prepared in the examples and comparative example was observed under an optical microscope [SMZ745T/Nikon]. If glue overflow occurred, a maximum distance of the glue overflowing outward from an outermost side of the opening was measured.

4. Bubbling Test

Existence of any bubbles remaining in the circuit boards prepared in the examples and comparative example was observed under an optical microscope [SMZ745T/Nikon] (10× magnification). Where no bubbles existed, "Pass" is recorded, and where bubbles exist, "NG" is recorded.

5. Peel Strength Test

The circuit boards laminated in the examples and comparative example were cut into test strips of 15 cm×1 cm. The polyimide layer was slightly separated from the copper lad laminate at the end of the test strip, and the peel strength was measured by the IPC-TM-650 test method (Number 2.4.9).

6. Bendability Test

Bendability was tested by using a Measure Infect Turn (MIT) test machine (K. D. H. Incorporation), at a bend angle of 135 degrees and a bend radius R=0.38 mm under a load of 500 g. The number of bends experienced by the circuit board until the circuit failed was recorded. A larger number of bends indicates a better physical property of the formed polyimide layer.

The test results of each example and comparative example are shown in Table 1.

TABLE 1

|  | Example 1 | Example 2 | Comparative Example 1 |
| --- | --- | --- | --- |
| Thickness (μm) | 27.7 | 28 | 40.4 |
| Glue overflow test (mm) | 0 | 0 | 0.2 |
| Bubbling test | Pass | Pass | NG |
| Adhesion test (Kgf/cm) | 1.01 | 0.83 | 0.714 |
| Bendability (number of bends) | 601 | 574 | 484 |

The method of the present invention includes preforming an opening (pre-patterning) on the dry film before lamination, and involves no exposure, development, or other complex steps, so the preparation process is simple and cost effective.

As can be known from Table 1, in the method of the present invention, a polyimide dry film containing no adhesive layer is used to prepare a coverlay, which brings about no glue overflow resulting from the adhesive or the polyimide itself, and allows excellent adhesion of the polyimide layer to the copper clad laminate. In addition, the circuit board produced by the present invention is lighter and thinner, and has better bendability and no obvious bubbles remaining at the lamination interface between the polyimide layer and the copper clad laminate.

The above-described embodiments of the present invention are intended to be illustrative only. Numerous alternative embodiments may be devised by persons skilled in the art without departing from the scope of the following claims.

What is claimed is:

1. A method for preparing a patterned polyimide coverlay on a substrate, comprising:
   (a) providing a polyimide dry film including a carrier and a non-photosensitive polyimide layer on the carrier, the non-photosensitive polyimide layer comprising:
      (i) a polyimide precursor or soluble polyimide; and
      (ii) a solvent;
   (b) forming a predetermined pattern on the polyimide dry film by mechanical punching or laser drilling the polyimide dry film to preform an opening;
   (c) then directly laminating the patterned polyimide dry film onto a substrate in such a manner that the non-photosensitive polyimide layer faces the substrate; and
   (d) forming a patterned polyimide coverlay by heating, wherein the content of the solvent is at least 5 wt % based on the total weight of the non-photosensitive polyimide layer;
   wherein the thickness of the polyimide coverlay is in the range of 2 μm to 15 μm,
   wherein no adhesive is used, and
   wherein the step (c) is a wet roller lamination process.

2. The method according to claim 1, wherein the substrate is a flexible printed circuit board.

3. The method according to claim 2, wherein step (c) comprises aligning the opening to a circuit on the printed circuit board.

4. The method according to claim 1, wherein the solvent content is in the range of 5 wt % to 70 wt % based on the total weight of the non-photosensitive polyimide layer.

5. The method according to claim 1, wherein the method is carried out in a roll-to-roll manner.

6. The method according to claim 1, wherein the solvent comprises dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol monomethyl ether, tetraethylene glycol dimethyl ether, 2-butoxyethanol, γ-butyrolactone, xylene, toluene, hexamethylphosphoramide, propylene glycol monomethyl ether acetate,

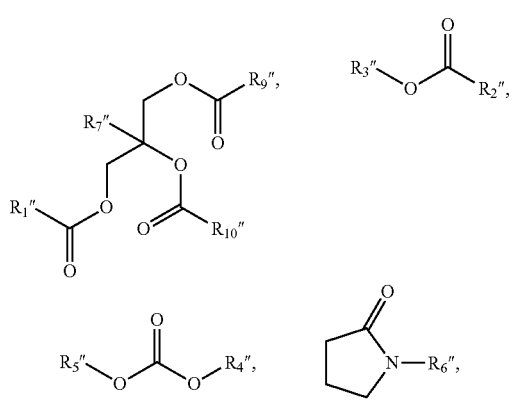

-continued

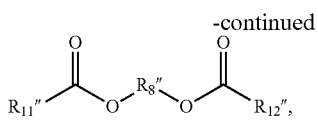 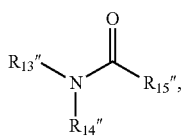

or a mixture thereof,
wherein
$R_1''$, $R_9''$ and $R_{10}''$ each independently represent $C_1$-$C_{20}$ alkyl, $C_2$-$C_{20}$ alkenyl, or $C_2$-$C_{20}$ alkynyl;
$R_7''$ is H or $C_1$-$C_3$ alkyl;
$R_2''$ is $C_1$-$C_{10}$ alkyl;
$R_3''$ is $C_4$-$C_{20}$ alkyl or —$C_2$-$C_{10}$ alkyl-O—$C_2$-$C_{10}$ alkyl;
$R_4''$ and $R_5''$ each independently represent $C_1$-$C_{10}$ alkyl, or $R_4''$ and $R_5''$, together with the oxygen atoms to which they are attached, form a 5 to 6-membered heterocyclic ring;

$R_6''$ is $C_1$-$C_{15}$ alkyl, $C_2$-$C_{20}$ alkenyl, $C_4$-$C_8$ cycloalkyl or

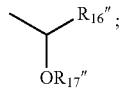

$R_8''$ is $C_2$-$C_{10}$ alkylene;
$R_{11}''$ and $R_{12}''$ each independently represent $C_1$-$C_{10}$ alkyl;
$R_{13}''$ and $R_{14}''$ each independently represent $C_1$-$C_{10}$ alkyl, or $R_{13}''$ and $R_{14}''$, together with the nitrogen atom to which they are attached, form a 5 to 6-membered heterocyclic ring;
$R_{15}''$ is H, $C_1$-$C_{15}$ alkyl or $C_4$-$C_8$ cycloalkyl;
$R_{16}''$ is $C_1$-$C_4$ alkyl; and
$R_{17}''$ is $C_4$-$C_{10}$ alkyl.

* * * * *